US010090210B2

(12) United States Patent
Shatalov et al.

(10) Patent No.: US 10,090,210 B2
(45) Date of Patent: Oct. 2, 2018

(54) MATERIAL GROWTH WITH TEMPERATURE CONTROLLED LAYER

(71) Applicant: Sensor Electronic Technology, Inc., Columbia, SC (US)

(72) Inventors: Maxim S. Shatalov, Columbia, SC (US); Mikhail Gaevski, West Columbia, SC (US); Igor Agafonov, Columbia, SC (US); Robert M. Kennedy, Columbia, SC (US); Alexander Dobrinsky, Loudonville, NY (US); Michael Shur, Latham, NY (US); Emmanuel Lakios, Elgin, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 15/283,459

(22) Filed: Oct. 3, 2016

(65) Prior Publication Data

US 2017/0098539 A1   Apr. 6, 2017

Related U.S. Application Data

(60) Provisional application No. 62/236,040, filed on Oct. 1, 2015.

(51) Int. Cl.
*H01L 21/687* (2006.01)
*H01L 21/66* (2006.01)
(Continued)

(52) U.S. Cl.
CPC .......... *H01L 22/20* (2013.01); *C23C 16/4586* (2013.01); *C23C 16/46* (2013.01);
(Continued)

(58) Field of Classification Search
CPC .......... H01L 21/0262; H01L 21/67248; H01L 21/68757; H01L 21/302; H01L 21/02021
See application file for complete search history.

(56) References Cited

U.S. PATENT DOCUMENTS 5,426,343 A * 6/1995 Rhodes ................ C04B 35/111
313/623
8,465,590 B2 * 6/2013 Kelekar ............ H01L 21/02002
118/715

(Continued)

OTHER PUBLICATIONS

Zilko, John L. "Metal Organic Chemical Vapor Deposition: Technology and Equipment." Handbook of Thin Film Deposition, 2nd ed., Seshan, K, 2002, pp. 151-152.*

*Primary Examiner* — Kyoung Lee
*Assistant Examiner* — Christina Sylvia
(74) *Attorney, Agent, or Firm* — LaBatt, LLC

(57) ABSTRACT

A metal-organic chemical vapor deposition (MOCVD) growth with temperature controlled layer is described. A substrate or susceptor can have a temperature controlled layer formed thereon to adjust the temperature uniformity of a MOCVD growth process used to epitaxially grow semiconductor layers. In one embodiment, the substrate and/or the susceptor can be profiled with a shape that improves temperature uniformity during the MOCVD growth process. The profiled shape can be formed with material that provides a desired temperature distribution to the substrate that is in accordance with a predetermined temperature profile for the substrate for a particular MOCVD process.

18 Claims, 14 Drawing Sheets

(51) Int. Cl.

| | |
|---|---|
| *H01L 21/67* | (2006.01) |
| *H01L 21/302* | (2006.01) |
| *H01L 21/02* | (2006.01) |
| *H01L 29/06* | (2006.01) |
| *C23C 16/458* | (2006.01) |
| *C23C 16/46* | (2006.01) |

(52) U.S. Cl.
CPC ...... *H01L 21/02021* (2013.01); *H01L 21/302* (2013.01); *H01L 21/67103* (2013.01); *H01L 21/67248* (2013.01); *H01L 21/68735* (2013.01); *H01L 21/68757* (2013.01); *H01L 29/0692* (2013.01)

(56) References Cited

U.S. PATENT DOCUMENTS

| | | | |
|---|---|---|---|
| 9,087,695 | B2 | 7/2015 | Agafonov et al. |
| 9,404,182 | B2 | 8/2016 | Agafonov et al. |
| 2004/0244695 | A1* | 12/2004 | Hashikura ........... C23C 16/4581 118/728 |
| 2005/0172895 | A1* | 8/2005 | Kijima ............... C23C 16/45508 118/715 |
| 2012/0171377 | A1* | 7/2012 | Volf .................. H01L 21/68757 427/255.28 |
| 2016/0355947 | A1 | 12/2016 | Dobrinsky et al. |

\* cited by examiner

MATERIAL GROWTH WITH TEMPERATURE CONTROLLED LAYER

REFERENCE TO RELATED APPLICATIONS

The present patent application claims the benefit of U.S. Provisional Application No. 62/236,040, which was filed on 1 Oct. 2015, and which is hereby incorporated by reference.

TECHNICAL FIELD

The present invention relates generally to epitaxial film deposition of semiconductor layers in a Metal-Organic Chemical Vapor Deposition (MOCVD) growth process, and more particularly, to increasing the uniformity of the temperature over a wafer substrate supported by wafer carrier, such as a susceptor, that is undergoing epitaxial growth of semiconductor layers in MOCVD growth chamber.

BACKGROUND ART

During a typical MOCVD growth process, a wafer substrate may be directly placed on a susceptor in an MOCVD growth chamber. The susceptor, which can be mounted on a rotating shaft, provides support for the wafer substrate during the epitaxial growth of semiconductor layers thereon, while protecting the back side of the wafer. In this environment, epitaxially grown semiconductor layers require precise control of fabrication process parameters so as to reduce operation and process variations and improve the quality, performance and yield of the epitaxially grown semiconductor layers. For example, the uniformity of the temperature over the wafer substrate during a MOCVD growth process is one parameter that requires control.

Thermal uniformity of the wafer substrate during MOCVD growth processing is important, especially for epitaxially grown semiconductor materials such as group III nitride semiconductors that are frequently used in microprocessors, memory integrated circuits and other high density devices. A non-uniform temperature distribution on an epitaxially grown semiconductor layer may generate different chemical reaction rates at different portions of the epitaxially grown semiconductor layers on the wafer substrate. As a result, the material composition of the epitaxially grown semiconductor layers and the deposition rate of the layers may be altered by temperature inhomogeneities arising from the non-uniform temperature distribution. This can cause the epitaxially grown semiconductor layers to be non-uniform across the wafer substrate. In extreme cases, the wafer substrate can bow enough to crack or break, damaging or ruining the epitaxially grown semiconductor layers.

Heating sources, such as inductive heating coils, resistive heating coils or lamps, are commonly employed as a heating source to heat a wafer substrate supported by a susceptor to a predetermined temperature set point during a typical MOCVD growth process. However, it is difficult to precisely control the temperature distribution imparted from these heating sources onto the wafer substrate. Quite often, the temperature distribution generated from these heating sources can be different from a target temperature specified for the MOCVD growth process. This can lead to epitaxially grown semiconductor layers having a non-uniform temperature distribution which can damage or ruin the grown semiconductor layers.

SUMMARY OF THE INVENTION

This Summary Of The Invention introduces a selection of certain concepts in a brief form that are further described below in the Detailed Description Of The Invention. It is not intended to exclusively identify key features or essential features of the claimed subject matter set forth in the Claims, nor is it intended as an aid in determining the scope of the claimed subject matter.

Aspects of the present invention are directed to obtaining a desired temperature distribution over a wafer substrate supported by a wafer carrier, such as a susceptor, during the epitaxial growth of semiconductor layers in a MOCVD growth process. The temperature distribution can be adjusted by implementing a temperature-controlled layer in the substrate and/or the susceptor that, for example, increases the uniformity of the temperature over the substrate during the MOCVD growth process. In one embodiment, the backside of the substrate, or the top portion of the susceptor or close thereto, can have at least one metallic domain. The metallic domain can be selected in accordance with a predetermined temperature profile developed for epitaxial growth of semiconductor layers in a particular MOCVD growth process. In this manner, a type of material can be selected for the metallic domain that is well suited for the MOCVD growth process, as well as a particular location for forming the metallic material. The type of material and location make it possible to optimize the heating over the substrate to control precisely the distribution and uniformity of the temperature to the substrate.

In one embodiment, the metallic domain can be placed over a central area of the substrate or the susceptor. For example, the metallic domain can have a continuous thickness profile such that the thickness is greater in the central area of the substrate and decreases gradually towards the edges of the substrate. Not only is there improved temperature uniformity, but this continuous thickness profile enables avoidance of temperature jumps within the substrate.

In one embodiment, the metallic domain can comprise a material like Molybdenum, Tungsten and similar materials that can have a melting temperature that is higher than typical MOCVD operating temperatures that can range from about 900° Celsius to about 1800° Celsius. For example, a material with a melting temperature that is greater than 2000° Celsius is well suited for use as a metallic domain in one of the various embodiments described herein.

In another embodiment, the metallic domain can comprise metallic dots, metallic wires, a mesh with metallic elements, resistive heating elements and other metallic elements incorporated therein. These elements that are used in a metallic domain can have different sizes, forms, characteristic dimensions, etc.

The metallic domain can be formed and applied in a variety of ways with the substrate or susceptor. For example, metallic film can be placed over the substrate or the susceptor surface, and subsequently be bonded to either one using a bonding material, like fused silica, that has a melting temperature that is sufficiently high enough not to disintegrate during a MOCVD process. Depositing, annealing, evaporating, sputtering and melting the metallic domain over the substrate and/or the susceptor are other approaches that also can be used.

The various embodiments are not solely limited to the use of metallic domains in the substrate and/or the susceptor to improve the heating uniformity during a MOCVD process. For example, semiconductor domains and dielectric domains can be incorporated with the substrate and/or the susceptor.

In other embodiments, the temperature controlled layer can be formed by profiling the substrate or the susceptor with a shape that optimizes temperature uniformity during the MOCVD growth process. For example, the substrate can be profiled with a shape that thins the substrate towards the edges. In another embodiment, the substrate can be profiled with a shape that forms a concave surface. In one embodiment, the shape can form individual indented spaced segments within a surface of the substrate, wherein the individual indented spaced segments collectively establish a segmented concave surface. In one embodiment, the individual indented segments can contain a material selected from the group consisting of a metallic material, a composite metallic dielectric/semiconductor material, and a semiconductor material.

In one embodiment, the substrate can be profiled with a shape that comprises circular channel regions within the substrate. The circular channel regions can differ by thickness, wherein some circular channel regions have an increased thickness while other circular channel regions have a decreased thickness. In one embodiment, some of the circular channel regions can include a metallic domain, while some of the other circular channel regions can include a dielectric material.

In one embodiment, the substrate can be profiled with a shape that includes a plurality of nanochannels. The nanochannels can vary in shape, size and their density distribution on the surface of the substrate. In one embodiment, the nanochannels can be partially filled with a metallic material. In one embodiment, nanochannels located over a central portion of the substrate can be filled with a metallic material, while nanochannels located on an outer perimeter of the substrate can be filled a metal material or a composite material.

In one embodiment, the substrate can comprise a composite substrate having a plurality of sublayers. Each sublayer can comprise at least one island of material that differs from a material used for the substrate. The island of material can comprise a metallic material, a semiconductor material and a dielectric material. In one embodiment, the islands of material in the plurality of sublayers of the substrate can vary in shape and size.

The susceptor can also be profiled with a shape selected to optimize temperature uniformity during the MOCVD growth process. For example, the susceptor can be profiled with a shape that includes a top surface that is beveled from a central portion to the edges of the susceptor. In another embodiment, the susceptor can be profiled to have a concave region formed along a top surface of the susceptor. The concave region can be filled with a metallic semiconductor or a dielectric material.

By controlling the temperature of the epitaxially grown semiconductor layers in this manner with one of the various temperature controlled layers formed in the substrate and the susceptor, aspects of the present invention are able to more precisely control the process parameters during an MOCVD growth process. The better control can reduce operation and process variations and improve the quality, performance, and/or yield of epitaxially grown semiconductor layers.

The temperature controlled layer of the various embodiments described herein can be implemented in a system that includes a control unit and an in-situ measurement unit. In this manner, wafer bowing measurements can be obtained during the epitaxial growth of semiconductor layers. The control unit can adjust the operation of the heating unit to generate a heating radiation that imparts a uniform temperature distribution over the substrate. In one embodiment, the control unit can adjust the heating unit as a function of the wafer bowing measurements.

A first aspect of the invention provides a method, comprising: determining a temperature profile of a substrate supported by a susceptor in an MOCVD growth chamber for a MOCVD growth process in which semiconductor layers are epitaxially grown on the substrate; and forming a temperature-controlled layer on one of a backside of the substrate or a top surface of the susceptor, wherein the temperature-controlled layer is formed as a function of the temperature profile.

A second aspect of the invention provides a method, comprising: determining a temperature profile of a substrate supported by a susceptor in an MOCVD growth chamber for a MOCVD growth process in which semiconductor layers are epitaxially grown on the substrate; selecting an electrically conducting metal having a high melting temperature that optimizes a temperature uniformity over the substrate during the MOCVD growth process, wherein the electrically conducting material is selected as a function of the temperature profile and the melting temperature is greater than 2000° C.; forming at least one domain of the electrically conducting metal on one of a backside of the substrate or a top surface of the susceptor prior to initiating the MOCVD growth process, wherein the electrically conducting metal is formed on a location that has a need for increased heating; and performing the MOCVD growth process with substrate and the susceptor in the MOCVD growth chamber with the electrically conducting metal domain.

A third aspect of the invention provides a system, comprising: a wafer substrate; a wafer carrier supporting the wafer substrate; at least one metallic domain formed on one of a backside of the wafer substrate or a top surface of the wafer carrier to increase temperature uniformity during a MOCVD growth process; a heating unit configured to heat the wafer substrate on the wafer carrier; and a control unit configured to control heating of the wafer carrier by the main heating unit during the MOCVD growth process.

A fourth aspect of the invention provides a system, comprising: a wafer substrate; a wafer carrier supporting the wafer substrate; at least one metallic domain formed on one of a backside of the wafer substrate or a top surface of the wafer carrier to increase temperature uniformity during a MOCVD growth process; a heating unit configured to heat the wafer substrate on the wafer carrier during the MOCVD growth process; a control unit configured to control heating of the wafer carrier by the heating unit during the MOCVD growth process; and an in-situ measurement unit configured to obtain a plurality of measurements from the surface of the wafer substrate supported by the wafer carrier during epitaxial growth of semiconductor layers.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the present invention are directed to obtaining a desired temperature distribution over a wafer substrate supported by a wafer carrier, such as a susceptor, during the epitaxial growth of semiconductor layers in a MOCVD growth process. According to various embodiments of the present invention, the temperature distribution can be adjusted by implementing a temperature-controlled layer in the substrate and/or the susceptor that, for example, increases the uniformity of the temperature during the MOCVD growth process. The temperature-controlled layer of the various embodiments enables the attainment of target temperature characteristics over the surface of substrate such as, for example, an essentially uniform temperature over the surface of the substrate. Having the capability to attain a desired (e.g., more uniform) temperature distribution over the surface of the substrate makes it easier to yield epitaxially grown semiconductor layers in a MOCVD growth process according to specified temperature profiles, characteristics, distributions, and the like.

Various illustrative embodiments described herein are directed to increasing a uniformity of a temperature over a surface of a substrate during growth of semiconductor layers thereon. However, it is understood that this embodiment is only illustrative, and other embodiments can be configured to create any desired surface temperature characteristics for the surface of the substrate, including non-uniform target variations. For example, for uniform epitaxial semiconductor growth, both temperature distribution over a surface as well as gas concentration, flow directions, and flow velocities, affect the epitaxial deposition rate. Thus, for a particular gas flow distribution, a particular substrate surface temperature profile, which may not be uniform over the surface of the substrate, may be preferred. In general, it is foreseeable that the non-uniform epitaxial growth also may be desired, which can be controlled using a non-uniform substrate surface temperature profile.

The various illustrative embodiments described herein are suitable for epitaxial growth processes that utilize MOCVD. However, it is understood that embodiments of the present invention are not meant to be limited to MOCVD. For example, those skilled in the art will appreciate that other types of depositions, such as chemical vapor deposition (CVD) can have applicability with the various embodiments described herein.

Figure 1A:
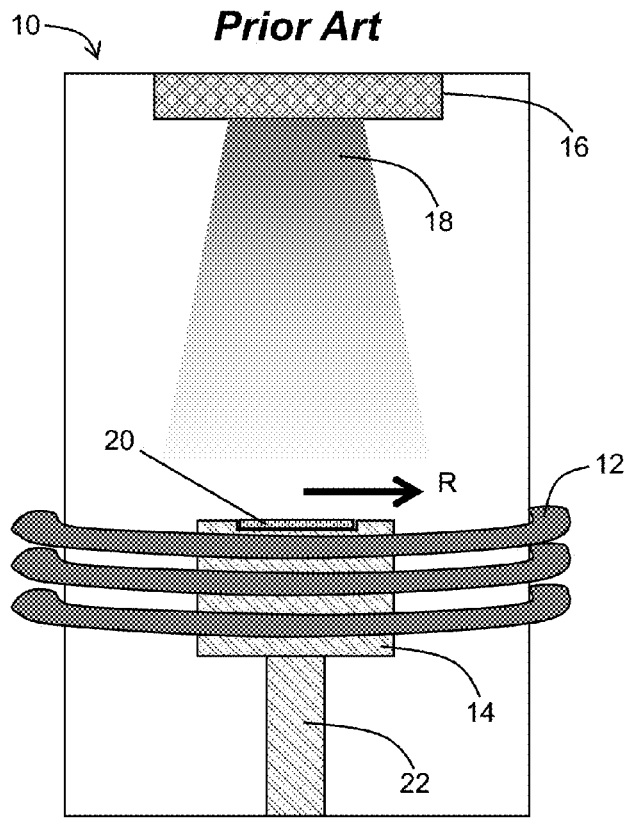
FIG. 1A shows a schematic of a MOCVD chamber with an induction heating coil used to heat a substrate and a susceptor supporting the substrate according to the prior art.
Figure 1B:
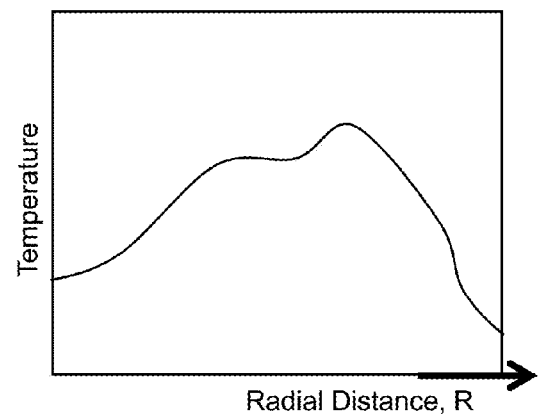
FIG. 1B shows a typical non-uniform temperature distribution formed over a surface of the substrate depicted in FIG. 1A during the epitaxial growth of semiconductor layers.

Referring now to the drawings, FIG. 1A shows a schematic of a MOCVD growth chamber 10 with an induction heating coil 12 such as an RF inductive coil, used to heat a wafer carrier such as a susceptor 14 according to the prior art, while FIG. 1B shows a typical non-uniform temperature distribution formed over a surface of the substrate depicted in FIG. 1A during the epitaxial growth of semiconductor layers. As shown in FIG. 1A, the MOCVD growth chamber 10 further includes a showerhead element 16 located at a top portion of the chamber. The showerhead element 16 can release a flow of gases 18 towards a wafer substrate 20 located in a top region of the susceptor 14 during a MOCVD epitaxial growth process in which semiconductor layers such as group III nitride semiconductor layers are epitaxially grown. In one embodiment, the epitaxial growth of group III nitride semiconductor layer can include an $Al_xIn_yB_zGa_{1-x-y-z}N$ semiconductor alloy with $0 \leq x,y,z \leq 1$ and $0 \leq x+y+z \leq 1$. The gases released from the showerhead element 16 that can grow group III nitride semiconductor layers can include, but are not limited to, $NH_3$, $H_2$, and metalorganic gases.

During the epitaxial growth process, the induction heating coil 12 located about the susceptor 14 can heat the susceptor while it rotates about a shaft 22. The susceptor 14 can include material such as alumina, steel and any other elements capable of withstanding temperatures of about 2000K without affecting the gas dynamics within the chamber 10. The induction heating coil 12, can be water-cooled induction coils, capable of operating at about 20-40 kHz at currents of 1000-10000 Amperes. In some examples of semiconductor growth of group III nitride semiconductor layers, temperatures in the chamber 10 over the surface of the wafer 20 supported by the susceptor 14 can range from about 800° C. to about 1600° C.

Substrates supported by susceptors that are heated by heating elements such as induction coils are susceptible to non-uniform heating. This can result in regions of the surface of the substrate having a non-uniform temperature distribution. As a result, the material composition of the epitaxially grown semiconductor layers and the deposition rate of the layers may be altered by temperature inhomogeneities arising from the non-uniform temperature distribution. This can cause the epitaxially grown semiconductor layers to be non-uniform across the wafer substrate. In extreme cases, the substrate can bow enough to crack or break, thus damaging or ruining the epitaxially grown semiconductor layers.

FIG. 1B shows an example of a typical non-uniform temperature distribution formed along a surface of the substrate 20 depicted in FIG. 1A. As shown in FIG. 1B, the temperature distribution is not uniform along the surface of the substrate 20 in a radial direction R. This non-uniform temperature distribution along the radial direction R can be due to a number of factors. For example, the overall growth temperature, the type of semiconductor structure grown, and various other considerations can play a role in causing the temperature distribution to be varied. However, a significant contributor to the non-uniform temperature distribution may be the induction heating coil 12. It is not uncommon that conventional MOCVD systems can have temperature variations in the range of tens of degrees Celsius, for the growth at average temperatures of about 1000° C. Even with such small variations in the temperature along the substrate, this can lead to semiconductor layers having different characteristics, which affect the device performance. For example, devices fabricated from semiconductor layers that are located on the outskirts of the substrate have been found to have different properties than the devices fabricated from the central region of the substrate wafer.

In order to overcome the drawbacks of conventional MOCVD systems, a temperature-controlled layer can be implemented in the substrate and/or the susceptor as set forth in the various embodiments in order to, for example, increase the uniformity of the temperature during the MOCVD growth process. As used herein, the temperature-controlled layer is any layer over a surface of substrate or within a substrate that allows for control of temperature distribution over a surface of the substrate. In an embodiment, a temperature-controlled layer can comprise a composite layer of variable composition and thickness. In an embodiment, such a composite layer can comprise a matrix material and a filler, where the matrix material can comprise a dielectric such as $SiO_2$, $Al_2O_3$, graphite, and/or the like, and where the filler can comprise a metal, such as tungsten. In general, it is understood that a temperature-controlled layer can comprise cavities and domains having different composition. In yet another embodiment, the temperature-controlled layer can comprise a portion of the substrate that contains cavities, insertions of composite material, insertions of dielectric or metallic material, patterning and/or combinations of thereof.

In general, the temperature-controlled layers of the various embodiments can be formed upon determining a temperature profile for a substrate supported by a susceptor in a MOCVD chamber that is used to epitaxially grow semiconductor layers in a MOCVD growth process for each stage of growth. As used herein, a temperature profile is defined as a temperature distribution along the surface of the susceptor. In a more particular embodiment, the temperature profile is a radial function for a circular susceptor and determines the surface temperature as a function of a radial distance from the center of the susceptor. In one embodiment, the temperature profile can be determined by a pyrometer.

With this information, a temperature controlled layer can be configured for the substrate including the top surface and the backside, and/or the susceptor with specific shapes and, materials at particular locations that will facilitate the attainment of specified temperature distributions (e.g., uniform temperature distribution), temperature characteristics, and the like that are in accordance with the determined temperature profile. Attaining target temperature characteristics over the surface of a substrate in this manner makes it easier to yield epitaxially grown semiconductor layers in a MOCVD growth process that do not have damaged layers.

The temperature-controlled layer of the various embodiments enables the attainment of target temperature characteristics over the surface of the substrate such as, for example, an essentially uniform temperature over the surface of the substrate. Having the capability to attain a more uniform temperature distribution over the surface of the substrate makes it easier to yield epitaxially grown semiconductor layers in a MOCVD growth process according to specified temperature profiles, characteristics, distributions, and the like.

Figure 2A:
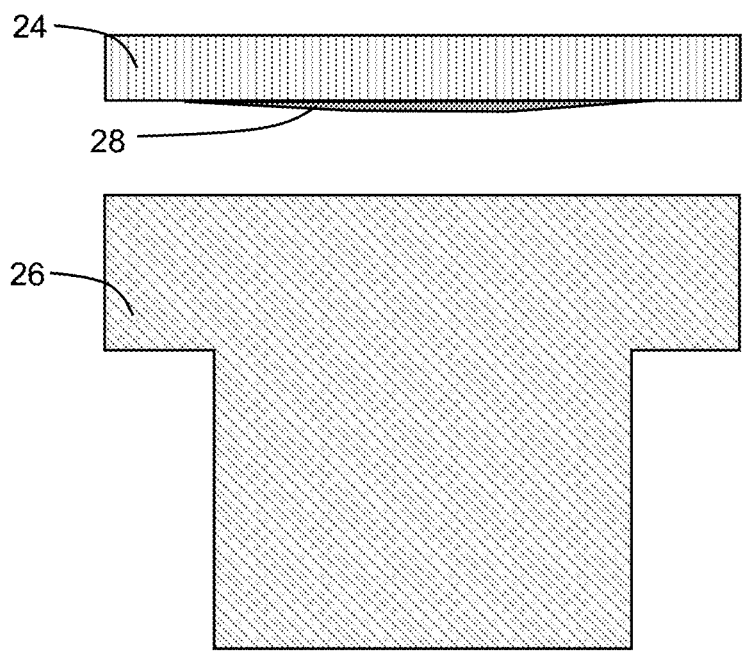
FIGS. 2A-2B show schematic views of the backside of the substrate having a metallic domain according to an embodiment.
Figure 2B:
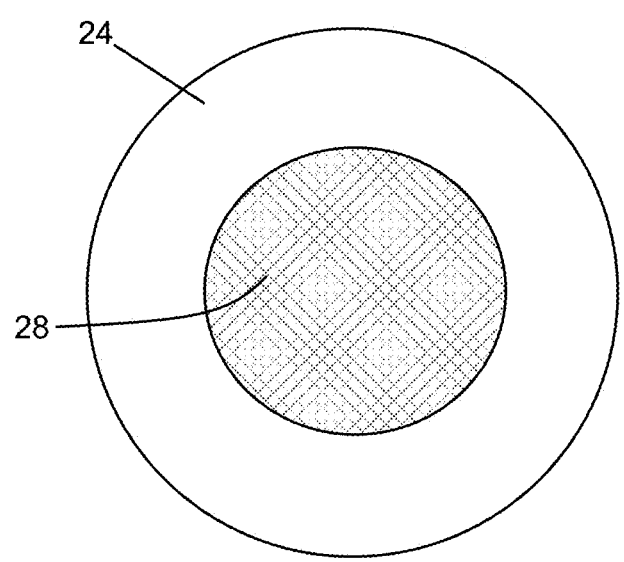

FIGS. 2A-2B show schematic views of the backside of a substrate 24 that is to be placed on a susceptor 26 with a metallic domain 28 according to an embodiment. In particular, FIG. 2A shows a side view of the substrate 24 with the metallic domain 28 and the susceptor 26 prior to placement of the substrate on the susceptor, while FIG. 2B shows a view of the substrate 24 with the metallic domain 28 as viewed toward the backside of the substrate. As shown in FIGS. 2A-2B, the metallic domain 28 can be placed over a central area of the substrate 24. In one embodiment, the metallic domain 28 can have a continuous thickness profile. As shown in FIG. 2A, the thickness of the metallic domain 28 can be greater in the central area of the substrate 24 and gradually decrease towards the edges of the substrate. In one embodiment, the metallic domain 28 of this configuration can be formed by deposition. Having a metallic domain with a continuous thickness profile, such that it is thicker in the central area of the substrate 24 and gradually decreases towards the edges allows for improved temperature uniformity resulting from variable thermal conductivity of the metallic domain due to the variations in thickness.

In one embodiment, the metallic domain 28 can comprise molybdenum, tungsten, and/or the like. In addition, the metallic domain 28 can also comprise similar materials that can have a melting temperature that is higher than typical MOCVD operating temperatures that can range from about 900° Celsius to about 1800° Celsius. For example, a material with a melting temperature that is greater than 2000° Celsius is well suited for use as a metallic domain 28. In this manner, the metallic domain 28 can have a melting temperature that is higher than the highest temperature achieved during MOCVD growth. This allows certain portions of the substrate 24 to attain any increased heating requirements that are specified in the temperature profile for the MOCVD growth process.

In one embodiment, the metallic domain 28 can include a foil that is deposited over a surface of the substrate 24 prior to melting. In another embodiment, the metallic domain 28 can comprise a mesh with metallic elements that are deposited over the surface of the substrate 24. In another embodiment, the metallic domain 28 can have sufficiently high adhesive properties to adhere to the substrate 24 during a growth process described herein.

Although FIGS. 2A-2B show the metallic domain 28 formed on the backside of the substrate 24, it is possible to have the metallic domain formed on the top surface of the susceptor 26 and still attain the benefits of improved temperature uniformity and avoidance of temperature jumps. Also, it is understood that the metallic domain 28 can be placed or formed on the backside of the substrate 24 or the top surface of the susceptor 26 using other approaches besides deposition. For example, evaporation, sputtering, and melting can be used to form the metallic domain 28 on the backside of the substrate 24 or the top surface of the susceptor 26 with a thickness that provides the adequate (optimal) temperature uniformity. In one embodiment, such as for example, when the metallic domain 28 takes the form of a mesh, a thin film or other patterned configuration, bonding and annealing can be used with a deposition technique. It is understood that the temperatures selected for annealing should be chosen such that they are sufficiently high to result in metal/substrate bonding or metal/susceptor bonding and prevent the metallic domains 28 from dismantling from the substrate 24 or the susceptor 26.

Figure 3A:
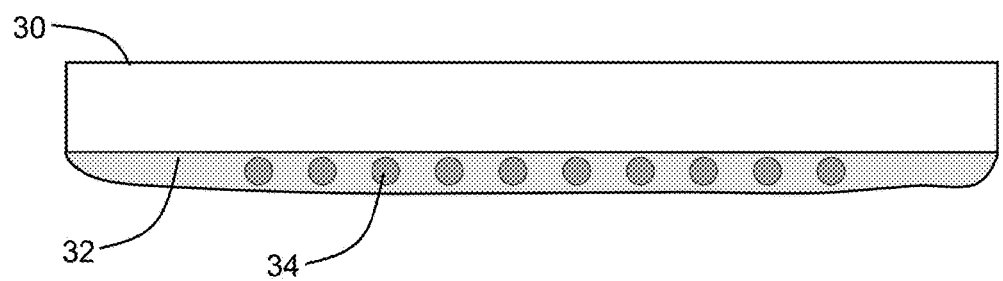
FIGS. 3A-3B show schematic views of the backside of the substrate having a composite layer formed from at least one metallic domain and a bonding material according to an embodiment.
Figure 3B:
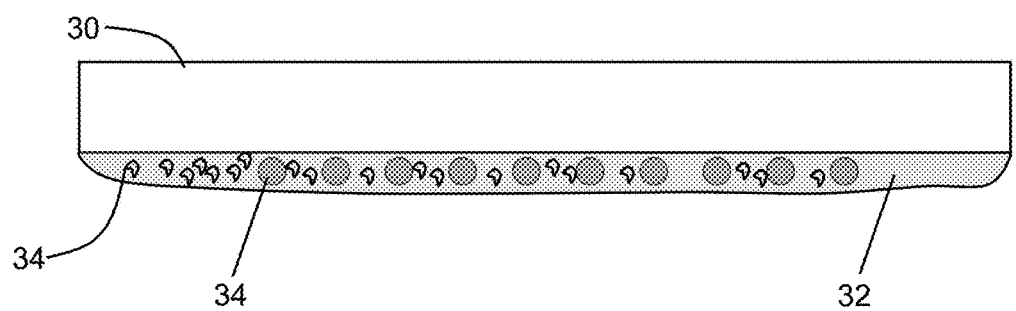

FIGS. 3A-3B show schematic views of the backside of a substrate 30 having a composite layer 32 formed from a composite material including metal. In one embodiment, the composite material can include a metallic film formed over the backside of the substrate 30. In addition, the composite material can include, but is not limited to, fused silica, amorphous aluminum oxide, amorphous SiC, graphite, and/or the like. It is understood that the bonding material should have a melting temperature that is sufficiently high in order to not disintegrate during the MOCVD growth process.

FIGS. 3A-3B show that the composite layer 32 can have also have at least one metallic domain 34 incorporated therein. The metallic domains 34 formed in the composite layer 32 can have different sizes, forms, characteristic dimensions, etc., as shown in FIG. 3B. The metallic domains 34 can take the form of any of a number of possible metallic elements. For example, the metallic domains 34 can include, but are not limited to, metallic dots, metallic wires, resistive heating elements, and other metallic elements incorporated within a matrix of bonding material. Although FIGS. 3A-3B show the composite layer 32 and the metallic domains 34 formed on the backside of the substrate 30, it is possible to have these elements formed on the top surface of the susceptor.

It is further understood that this embodiment as well as the others described herein are not meant to be limited to use solely of the metallic domains in the substrate and/or the susceptor to improve the heating uniformity during a MOCVD process. For example, semiconductor domains and dielectric domains can be incorporated with the substrate and/or the susceptor. In one embodiment, the semiconductor or dielectric domains can be incorporated within the bonding matrix, and can include, but are not limited to materials such as SiC, diamond, AAO, Sapphire, AlN and the like.

Figure 4A:
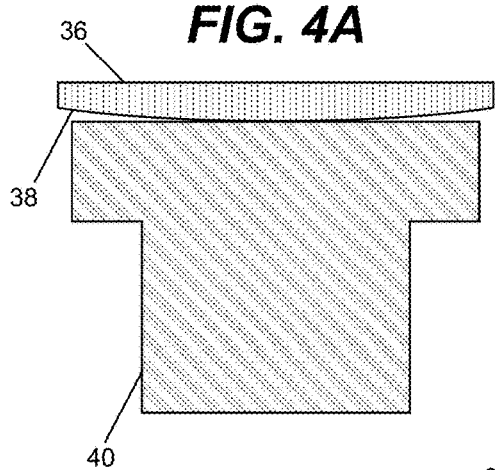
FIGS. 4A-4C show schematic views of substrates profiled with shapes that optimize temperature uniformity during the MOCVD growth process according to embodiments.
Figure 4B:
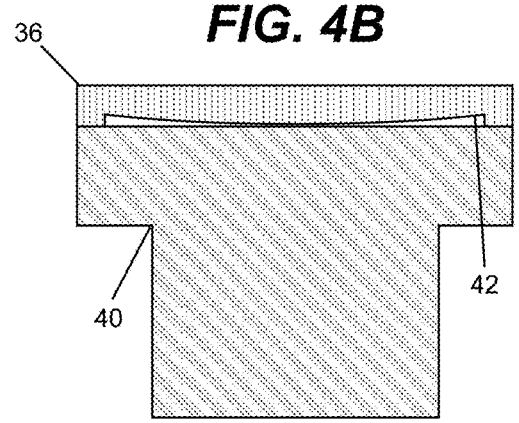
Figure 4C:
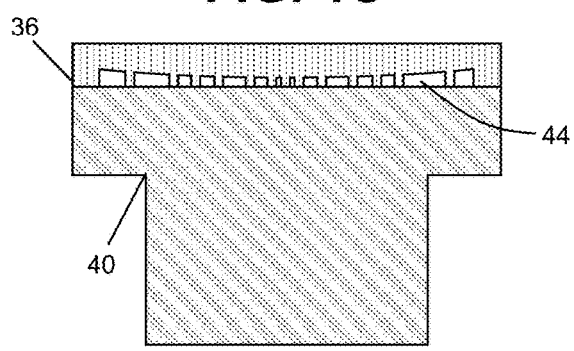

FIGS. 4A-4C show schematic views of substrates 36 profiled with shapes that optimize temperature uniformity during the MOCVD growth process according to embodiments. For example, as shown in FIG. 4A, the substrate 36 can be profiled with a shape that thins towards the edges 38 of the substrate, such that the edges extend upward away from a top surface of a susceptor 40. Having the substrate 36 with a shape that thins towards the edges can increase temperature uniformity by modifying the thermal conductivity of the substrate across the substrate with the thermal conductivity being a radially dependent function. In particular, thinning the substrate at the edges can decrease flow of heat towards an edge of the substrate resulting in a decrease of temperature at the edge region. FIG. 4B shows that the substrate 36 can be profiled with a shape that forms a concave surface 42 with respect to the top surface of the susceptor 40. Having the substrate 36 with a shape that forms a concave surface can increase temperature uniformity by having thermal conductivity be a function of a thickness of the substrate. FIG. 4C shows that the substrate 36 can be profiled with a shape that forms individual indented spaced segments 44 within a surface of the substrate. In one embodiment, these individual indented spaced segments can collectively establish a segmented concave surface with respect to the top surface of the susceptor 40. The individual indented spaced segments 44 within a surface of the substrate can increase temperature uniformity by modifying thermal conductivity of the substrate. It is understood that the size, position and the depth of these indentations can be chosen to result in an improved thermal profile, where an improved thermal profile is the one that better matches a target thermal profile. In an embodiment, the improved thermal profile can comprise a thermal profile with a reduced number of variations in temperature, wherein, for example, the variations in temperature can be measured through a function that can, for example, comprise integration of square of temperature deviation from the average temperature.

Figure 5A:
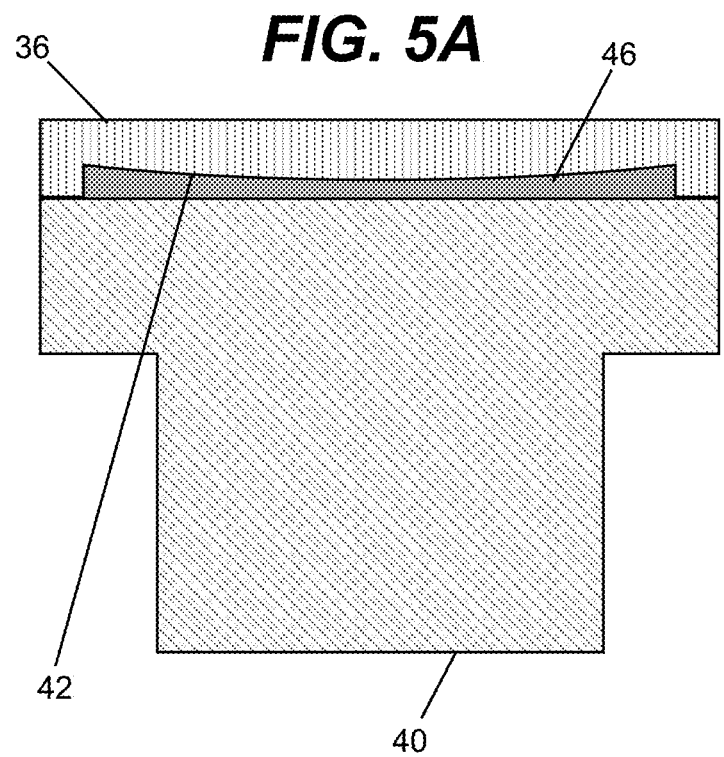
FIGS. 5A-5B show schematic views of substrates profiled with shapes similar to those depicted in FIGS. 4B-4C, respectively, that are filled with a material to increase temperature uniformity according to embodiments.
Figure 5B:
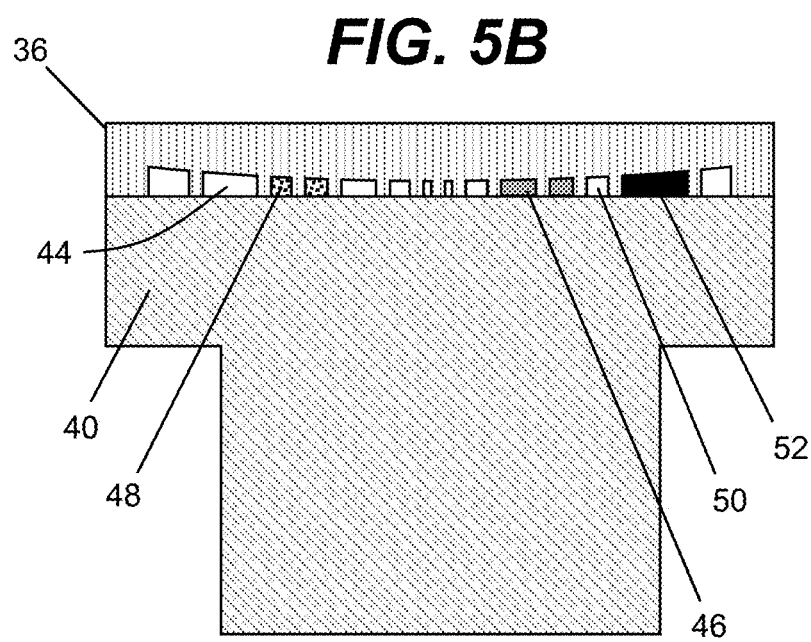

Any of the various concave surfaces can be used in conjunction with metallic domain(s) in embodiments. In one embodiment, as shown in FIG. 5A, a metallic domain 46 can be formed on the concave surface 42. In one embodiment, as shown in FIG. 5B, one or more of the individual indented segments 44 can contain a material selected from the group consisting of: a metallic material 46; a composite metallic dielectric/semiconductor material 48; a dielectric material 50; and a semiconductor material 52. Examples of a metallic material 46 include, but are not limited to, tungsten, tungsten based alloys that can include rhenium, and tantalum, as well as other high temperature refractory metals such as niobium and molybdenum. Examples of a composite material 48 include, but are not limited to, aluminum oxide and tungsten, graphite and SiC, $SiO_2$ and tungsten or similar refractory metal, and composites involving diamond. Examples of a dielectric material that are suitable for use as the dielectric 50 include, but are not limited to, $SiO_2$, $Al_2O_3$, AAO, diamond, and ultrahigh temperature ceramics (UHTC) such as borides, nitrides or oxides. Some examples include AlN, GaN, $HfB_2$, $ZrB_2$, TaC, and/or the like. Examples of a semiconductor material 52 include, but are not limited to, nitrides such as AlN, GaN, AlGaN and/or the like. Carbides, such as SiC, TiC, TaC, NbC, VaC, and/or the like, can be used as well.

The profiling of the shapes illustrated in FIGS. 4A-4C and FIG. 5A-5B can be formed using any of a variety of techniques. For example, shapes of FIGS. 4A-4C and FIG. 5A-5B can be formed by etching or by mechanical processing (polishing). It is understood that the profiling of the shapes of the substrate 36 in FIGS. 4B-4C and FIGS. 5A-5B will be a function of the radial distance from the center, and the same for each azimuthal angular direction. Furthermore, it is understood that although FIGS. 4B-4C and FIGS. 5A-5B show the substrate 36 with the profiled shapes, it is possible to profile these shapes on the top surface of the susceptor 40, or a region near the top surface. The materials filled in the profiled shapes of the substrates depicted in FIGS. 5A-5B can be performed by any of various well-known techniques including, but not limited to, physical vapor deposition, and/or sputtering.

Figure 6A:
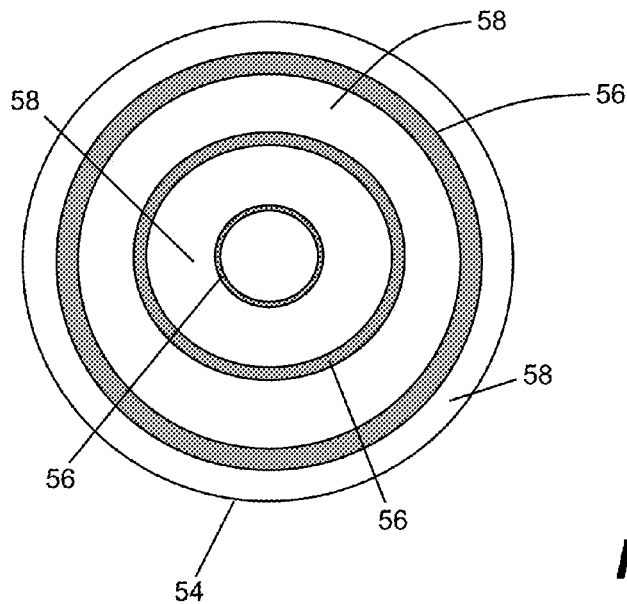
FIGS. 6A-6B show schematic views of a substrate profiled with circular channel regions according to an embodiment.
Figure 6B:
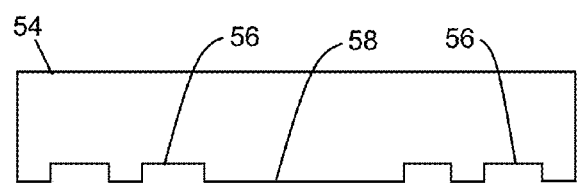
Figure 6B:
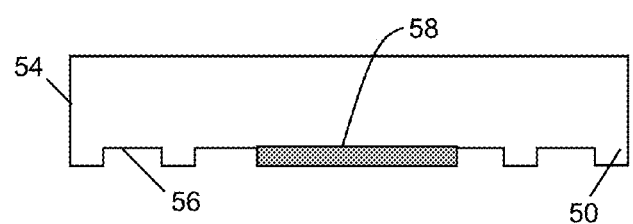
Figure 6B:
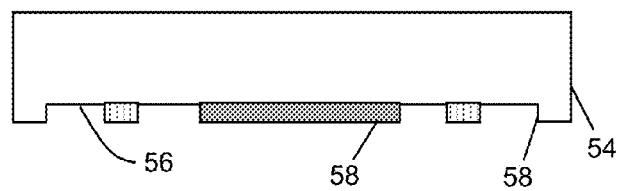

FIGS. 6A-6B show schematic views of a substrate 54 profiled with circular channel regions 56 according to an embodiment. In particular, FIG. 6A shows a view of a bottom side of a substrate 54 with circular channel regions 56 each separated from a wall 58 of an adjacent channel region, while FIG. 6B shows a cross-sectional view of variations of the channel regions for a similar substrate 54. In one embodiment, as illustrated in FIG. 6A, the substrate 54 can include circular channel regions 56 that have the same or varying thicknesses. For example, some circular channel regions 56 can have an increased thickness in relation to other channel regions, while other circular channel regions can have a decreased thickness in relation to other channel regions. In one embodiment, the outer portion of the substrate 54 can have circular channel regions 56 with a thickness that is greater than the thickness of the channel regions located in an inner portion of the substrate. Having the outer portion of the substrate 54 with circular channel regions 56 that are thicker than those regions located in the inner portion of the substrate serves to configure the thermal conductivity of the substrate to have variable characteristics, with the channel thickness and depth optimized to attain a target temperature profile over a surface of the substrate.

FIG. 6B shows that the walls 58 of the channel regions 56 formed in the substrate 54 can include a material that increases the thickness at these sections, as well as increases the temperature distribution over the surface. It is understood that in this embodiment and all other embodiments described herein, the increased temperature uniformity is particularly related to the temperature measured on the growth surface of the substrate wafer, as this is the region responsible for quality and uniformity of epitaxially grown layers in a MOCVD growth process. The material that can be formed on the walls 58 of the circular channel regions 56 can include any of the aforementioned metallic and dielectric materials. The material can also include a semiconductor material of low conductivity such as diamond, AlN, GaN and/or the like. In one embodiment, some of the walls 58 of the circular channel regions 56 can include a metallic domain (middle view of FIG. 6B). In another embodiment, the substrate 54 can have some walls of the channel regions with a metallic domain, while some of the walls of the other circular channel regions can include a dielectric material (bottom view of FIG. 6B).

The formation of the circular channel regions 56 in the substrate 54 can be performed using well-known techniques. For example, etching, mechanical means, or laser scribing can be used to form the circular channel regions. Similarly, the aforementioned material that can be formed on the walls 58 of the circular channel regions 56 of the substrate 54 can be implemented through well-known techniques. For example, physical vapor deposition and/or sputtering can be used to form the walls 58 of the circular channel regions 56 of the substrate 54.

FIGS. 7A-7D show schematic views of substrates 60 profiled with nanochannels 62 according to embodiments. The nanochannels 62 can increase the temperature uniformity over the substrates by providing an additional parametric control for regulating thermal conductivity of the substrate.

Figure 7A:
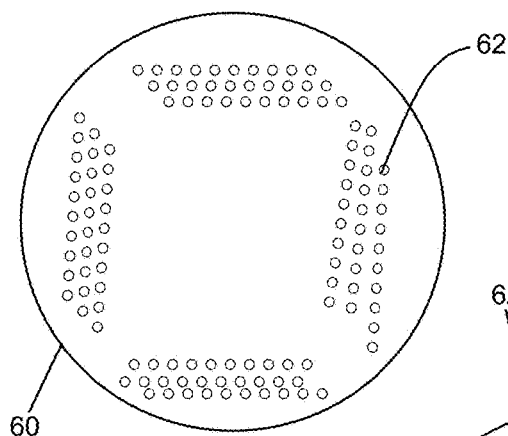
FIGS. 7A-7D show schematic views of substrates profiled with nanochannels according to embodiments.

In one embodiment, as shown in FIG. 7A, the substrate 60 can have the nanochannels 62 distributed over a given portion of the substrate wafer. For example, the nanochannels 62 can be distributed over the outer edge portion of the substrate 60. In this manner, the nanochannels 62 can reduce the thermal conductivity of the substrate at the outer edge resulting in improvement in uniformity of temperature profile over the substrate surface. As an alternative to FIG. 7A, the nanochannels 62 can be filled or partially filled with metal material and located in the middle of the substrate 62, while the outer edges or boundaries of the substrate can have low amounts or no metal material. In another alternative, the nanochannels 62 can be filled with a composite material including, but not limited to, sapphire, AlN, and fused silica particles with metallic nanoparticles.

Figure 7B:
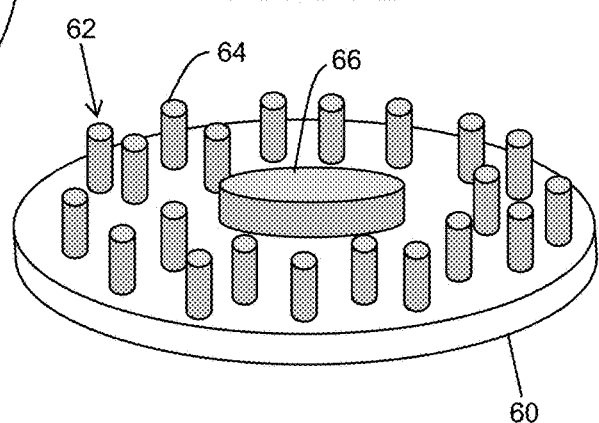

FIG. 7B shows the nanochannels 62 can have varying shapes. For example, the nanochannels 62 can include pillar-shaped nanochannels 64 and one or more circular, flatter nanochannels 66. In one embodiment, the pillar-shaped nanochannels 64 can be distributed on the outer portions of the substrate 62, while the circular, flatter nanochannel can be encircled by the pillar-shaped nanochannels. In one embodiment, the pillar-shaped nanochannels can have a variable density distribution on the outer portions of the substrate 62.

Figure 7C:
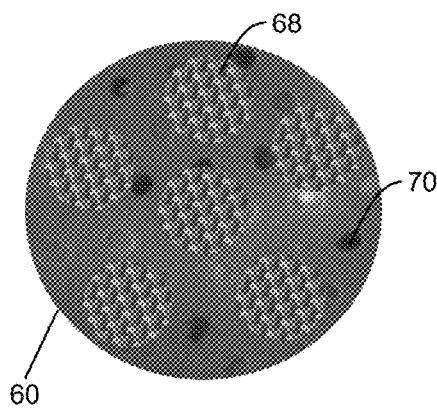

FIG. 7C shows that the nanochannels can be arranged in clusters 68 about the substrate 64. In one embodiment, the clusters 68 of nanochannels can be arranged about large vacancies 70 that can further control the thermal conductivity of the substrate. This embodiment with an arrangement of clusters 68 of nanochannels may be well-suited in applications where there is a requirement to control the temperature of the wafer in a particular prescribed way. For example, it may be desired that a particular target temperature profile not necessary be radially uniform. In this manner, this embodiment can be used to grow slightly different semiconductor layers in a different portion of the wafer or offset the temperature distribution due to non-uniform temperature distribution caused by a MOCVD heating and gas dynamics system.

Figure 7D:
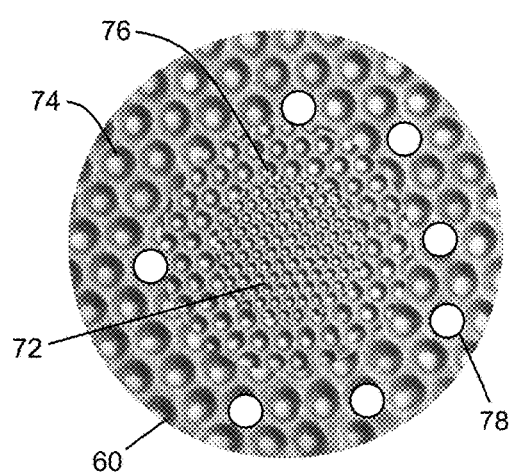

FIG. 7D shows another embodiment in which the nanochannels can vary in shape. For example, the nanochannels can comprise smaller channels 72 densely concentrated in the middle of substrate 60 and have larger channels 74 (e.g., at least four times the size of the smaller channels 72) distributed about the outer edges of the substrate surrounding the smaller channels. In one embodiment, medium-sized channels (e.g., at least two times the size of the smaller channels 72) can be distributed between the smaller channels 72 and the larger channels 74. In one embodiment, elements 78 can comprise domains of target thermal conductivity that can be distributed amongst the larger channels 74. For example, in an embodiment, such domains can comprise dielectric formations, formations comprising composite material, such as metallic/dielectric composites, and/or the like. In an embodiment, the material can contain graphite, graphene, or in some cases, carbon nanotubes. The configuration of the varying sized nanochannels in FIG. 7D can increase temperature uniformity in the substrate 60 by altering the thermal conductivity of the substrate.

In general, the nanochannels of FIGS. 7A-7D can be formed on the substrate 60 by micro and nano-patterning. For example, substrate 60 can include an AAO material comprising an $Al_2O_3$ amorphous layer with nanochannels. In another embodiment, the nanochannels can be partially filled with metallic material. It is understood that the embodiments depicted in FIGS. 7A-7D are not meant to be limited to nanochannels. For example, the nanochannels can be etched to form larger microchannels. In some cases, the nanochannels can be combined to form a large channel structure with a complex surface. Also, it is understood that depending on the method of fabrication used to form such nanochannels, their size and distribution can vary laterally throughout the substrate wafer.

Figure 8A:
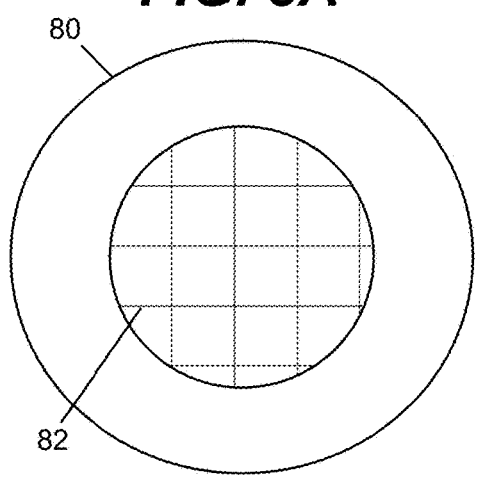
FIGS. 8A-8B show schematic views of substrates profiled with a mesh of metallic elements according to embodiments.
Figure 8B:
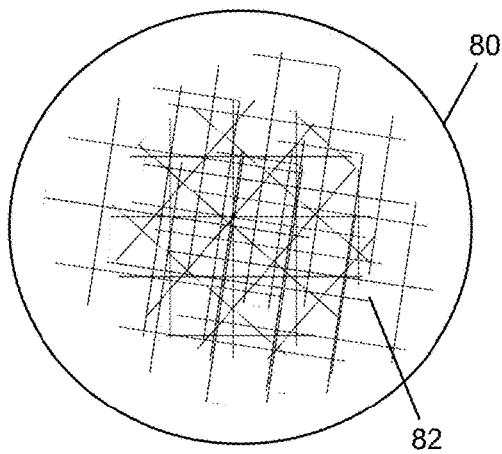

FIGS. 8A-8B show schematic views of substrates 80 profiled with a mesh 82 of metallic elements according to an embodiment. In one embodiment, as shown in FIG. 8A, a middle portion of the substrate 80 can contain the mesh 82 of mesh elements. Having the mesh 82 located in the middle portion of the substrate serves to further modify the lateral thermal conductivity of the substrate, spreading the heat throughout the substrate and thus reducing variations in temperature profile over a surface of the substrate. In one embodiment, the mesh 82 of metallic elements can be uniformly distributed about the middle portion of the substrate 80. As shown in FIG. 8B, the mesh 82 and mesh elements do not necessarily need to be uniform. For example, the mesh 82 and mesh elements can be non-uniform in its distribution throughout the middle portion of the substrate 80 and can include non-uniform collection of wires as shown in FIG. 8B. In one embodiment, the mesh 82 can have an arbitrary density at different domains over the surface of the substrate 80.

In one embodiment, the mesh 82 of FIGS. 8A-8B can comprise a metallic mesh made from a metallic material with a high melting point such as molybdenum or tungsten. Furthermore, the mesh 82 of FIGS. 8A-8B can be formed on the substrate 80 using well-known techniques such as bonding. For example, the mesh 82 can be bonded to the substrate 80 using either high temperature bonding, or a bonding material having a high melting temperature such as fused silica. Although FIGS. 8A-8B show the mesh 82 formed on the backside of the substrate 80, it is possible to have the mesh and the metallic elements formed on the top surface of the susceptor.

Figure 9:
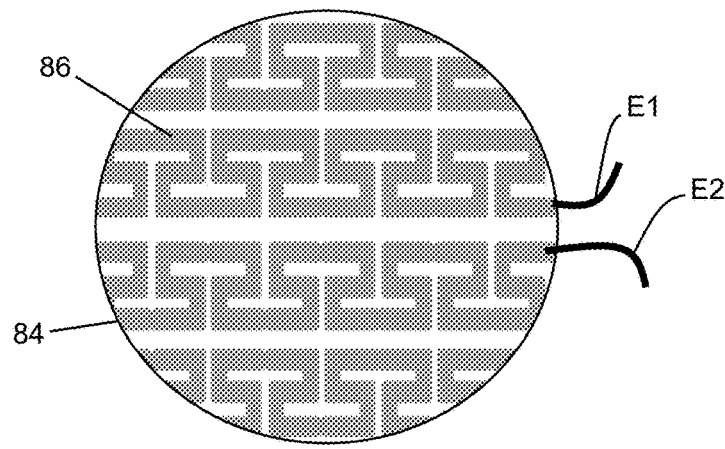
FIG. 9 shows a schematic view of a substrate profiled with a set of resistive heating elements according to an embodiment.

FIG. 9 shows a schematic view of a substrate 84 profiled with a set of resistive heating elements 86 according to an embodiment. In one embodiment, the set of resistive heating elements 86 can be designed to heat certain areas of the substrate 84 or a susceptor if located thereon instead of the substrate. In one embodiment, the resistive heating elements 86 can comprise conductive metallic materials having high melting temperature. Examples of conductive metallic materials having high melting temperature include, but are not limited to, tungsten, tungsten based alloys that can include rhenium, and tantalum, as well as other high temperature refractory metals such as niobium and molybdenum. As shown in FIG. 9, the set of resistive heating elements 86 can be powered by a number of electrodes such as E1 and E2. The set of resistive heating elements 86 can be formed on the substrate 84 or on a susceptor by well-known techniques that can include but are not limited to, physical vapor deposition, sputtering and wafer bonding using high temperature bonding.

Figure 10A:
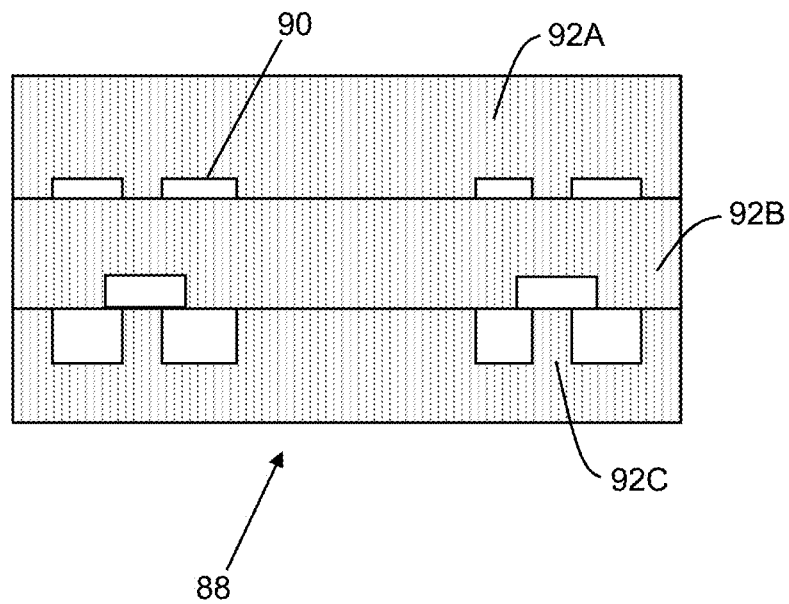
FIGS. 10A-10B show schematic views of a multi-layered substrate having islands of vacancies or cavities that can be filled with a material to promote control with the temperature distribution over the substrate according to an embodiment.
Figure 10B:
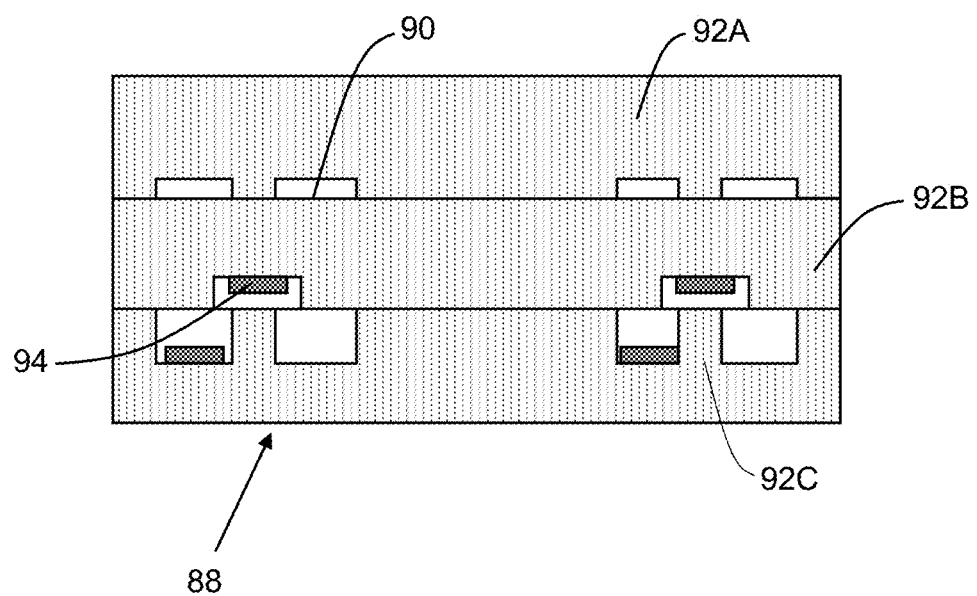

FIGS. 10A-10B show that the substrate used with any of the various embodiments described herein can take the form of a composite substrate having multiple sub-layers. For example, FIGS. 10A-10B show schematic views of a multi-layered substrate 88 having islands of vacancies 90 or cavities that can optionally be filled with a material to promote control with the temperature distribution over the substrate according to an embodiment. As shown in FIGS. 10A-10B, the multi-layered substrate 88 can include a composite substrate having a plurality of sublayers 92A, 92B and 92C, each having similar thermal expansion coefficients. It is understood that the composite substrate can have more or less sublayers than that depicted in FIGS. 10A-10B. Each sublayer include can include at least one island of vacancies 90 or cavities formed therein. In one embodiment, the vacancies 90 can vary in shape and size. For example, FIGS. 10A-10B show the sublayer 92A can have vacancies 90 according to a first shape and size, whereas sublayer 92B can have vacancies according to another shape and size, while sublayer 92C can have vacancies of a different size and shape than sublayers 92A and 92B.

In one embodiment, the vacancies 90 can be formed in the various sublayers of the composite substrate by etching or laser scribing. The vacancies 90 within the sublayers 92A, 92B and 92C enables the substrate to increase temperature uniformity or promote control of temperature uniformity by fabricating a composite substrate with a thermal conductivity having variable lateral control. It is understood that the arrangement of the vacancies 90 within the sublayers 92A, 92B and 92C is illustrative of one pattern and is not meant to limit the scope this embodiment.

In one embodiment, some or all of the vacancies 90 within the sublayers 92A, 92B and 92C can be filled or partially filled with a material 94 that promotes an increase in temperature uniformity over the substrate 88. The material 94 can comprises a material that is different from a material used for the substrate 88. In one embodiment, the material 94 can include a metallic material, a semiconductor material or a dielectric material. Any of the above-noted metallic, semiconductor and dielectric materials are examples of materials that can be used in this embodiment. As an example, FIG. 10B shows that sublayers 92B and 92C can have vacancies with a partially-filled material 94. It is understood that this is only example and that a multitude of different alternatives can be implemented As noted above, the susceptor in the MOCVD chamber can be profiled with a shape to promote an increase in temperature uniformity over the substrate as opposed to profiling the substrate. FIGS. 11A-11D illustrate various embodiments in which a susceptor in a MOCVD chamber can be profiled to promote an increase in temperature uniformity over the substrate or control the temperature distribution in a MOCVD growth process in which semiconductor layers are to be epitaxially grown. Note that in some cases, it may be preferred to apply modifications to the susceptor, to avoid costs associated with modifying each substrate wafer. Alternatively, it is understood that in some embodiments, both substrate wafer as well as susceptor can be modified to provide a desired temperature distribution.

Figure 11A:
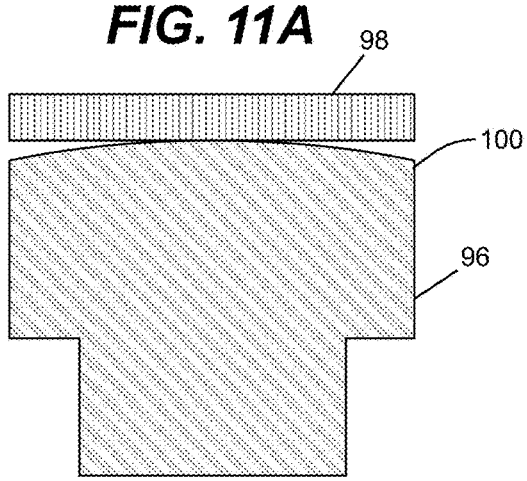
FIGS. 11A-11D show schematic views of susceptors profiled with shapes that optimize temperature uniformity during the MOCVD growth process according to embodiments.

FIG. 11A shows that a susceptor 96 can be profiled with a shape that thins towards the edges 100 of the susceptor 96, such that the edges extended downward from a bottom surface of a substrate 98. For example, the susceptor 96 can be profiled with a shape that includes a top surface that is beveled from a central portion to the edges of the susceptor. Having the susceptor 96 with a shape that thins towards the edges can increase temperature uniformity in the substrate by reducing the flow of heat towards the outer edge of the substrate.

Figure 11B:
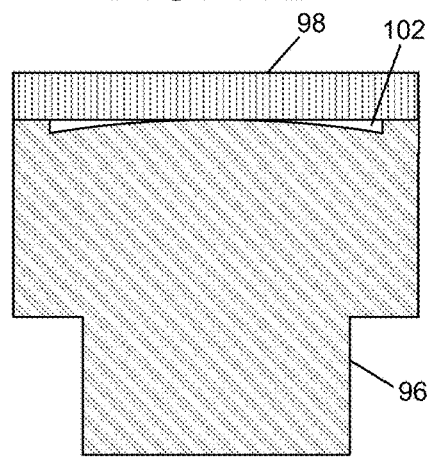

FIG. 11B shows that the susceptor 96 can be profiled with a shape that forms a concave surface 102 with respect to the bottom surface of the substrate 98. Having the susceptor 96 with a shape that forms a concave surface can increase temperature uniformity in the substrate by reducing the flow of heat towards the outer edge of the substrate.

Figure 11C:
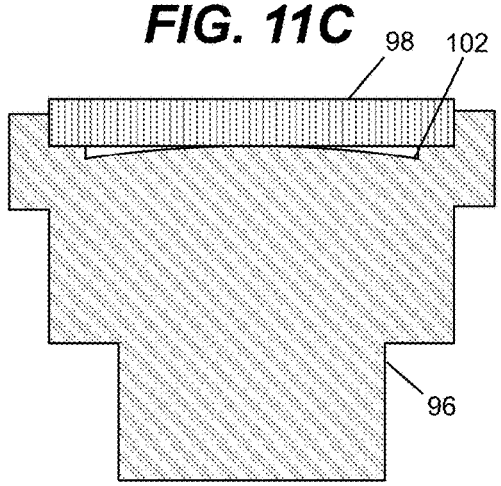

FIG. 11C shows another embodiment in which the susceptor 96 can be profiled with a shape that forms a concave surface 102 with respect to the bottom surface of the substrate 98. However, in this configuration, the susceptor 96 can be designed to allow the substrate wafer to be tightly placed over the susceptor without the possibility of falling from the susceptor during the rotation of the susceptor in the MOCVD growth process. For example, the design shown in FIG. 11C can be used to firmly hold the substrate 98 in place. Alternatively, the susceptor 96 can incorporate a suction mechanism to hold the substrate wafer 98 in place. For example, the suction mechanism can provide a different suction during the MOCVD growth process to partially offset any bowing that may arise due the semiconductor film growth. Examples of a suction mechanism include, but are not limited to, fabrication of vacuum underneath the substrate.

Figure 11D:
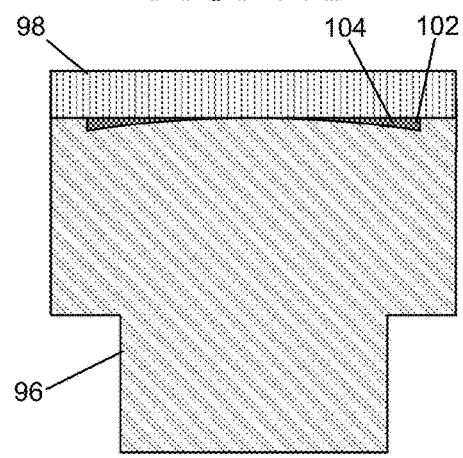

FIG. 11D shows another embodiment in which the susceptor 96 can be profiled with a shape that forms a concave surface 102 with respect to the bottom surface of the substrate 98. However, in this configuration a material 104 can be formed on the concave surface 102 that promotes the optimization of temperature uniformity over the substrate 98. The material 104 can be selected from the group consisting of a metallic material, a composite metallic dielectric/semiconductor material (e.g., SiC), a dielectric material, and a semiconductor material having a high melting temperature. Any of the above-noted materials listed as examples for the composite metallic dielectric/semiconductor material, the dielectric material, and the semiconductor material are suitable for this embodiment.

The profiling of the shapes illustrated in FIGS. 11A-11D can be obtain by using one of a number of well-known techniques. For examples, the shapes of FIGS. 11A-11D can be formed by etching, laser scribing or mechanical polishing. The materials filled in the profiled shapes of the susceptor 96 such as in the concave surface 102 can be performed by well-known techniques including, but not limited to, physical vapor deposition, sputtering or wafer bonding under high temperature.

In one embodiment, the susceptor 96 can be engineered to accommodate several substrates placed one over another. For such a configuration, a first substrate can be placed over the susceptor followed by a second substrate. The first substrate can be used for thermal management of the second substrate and have desired thermal electrical or mechanical properties. For example, the first substrate can comprise a SiC wafer that allows for uniform temperature distribution in the overlaying second substrate which can comprise sapphire, for example. Moreover, as described above, either side of the underlying first substrate wafer can contain profiling, indentations, metallic domains or domains with dielectric or semiconductor materials like those depicted and described herein.

While uniform temperature distribution may be desired for having uniform characteristics with a semiconductor film, another property which also may be desired to be controlled during epitaxial growth in a MOCVD growth process is bowing characteristics that are imparted on the substrate. In one embodiment, the substrate and/or the susceptor can be engineered to reduce or minimize the amount of bowing that occurs in a semiconductor device during room temperature.

Figure 12A:
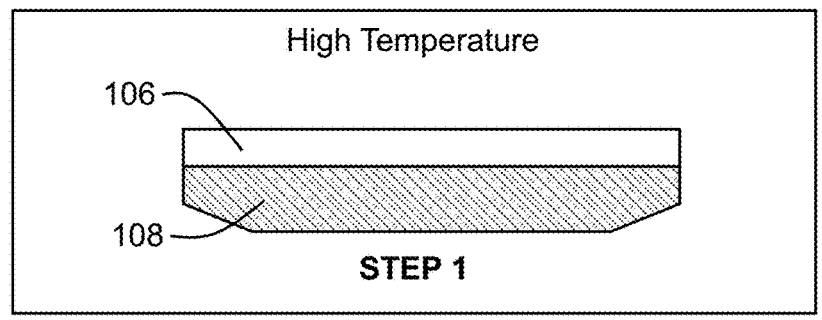
FIGS. 12A-12C illustrates a process to form a pre-bowed substrate for use during a MOCVD epitaxial growth process according to an embodiment.
Figure 12B:
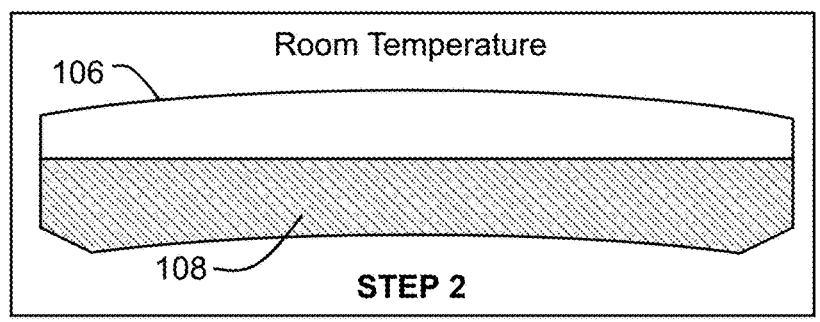
Figure 12C:
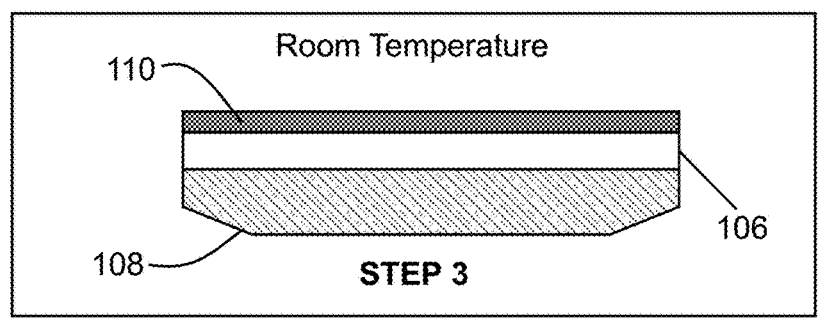

FIGS. 12A-12C illustrate a process to form a pre-bowed substrate for use during a MOCVD growth process in which semiconductor layers are epitaxially grown. In this process, as depicted in FIG. 12A, a substrate 106 is obtained and a layer 108 is deposited on the substrate at a high temperature to induce the bowing within the substrate at the room temperature. In one embodiment, the substrate 106 can be placed in a MOCVD chamber and the layer can be deposited at a temperature that ranges from about 800 Celsius to about 2000 Celsius. FIG. 12B shows the bowing that can arise in the structure formed from the substrate 106 and the layer 108 after being placed in room temperature. Once a pre-bowed substrate has been formed, it can then be used in a MOCVD growth process to epitaxially grow an additional layer 110 as depicted in FIG. 12C. The use of a pre-bowed substrate wafer in a subsequent MOCVD epitaxial growth process results in an epitaxial film introducing a compensating stress within the substrate 106. This results in a lower amount of bowing of the substrate-film system at room temperature.

The temperature controlled layer of the various embodiments described herein can be implemented in a system that includes a control unit and an in-situ measurement unit. In this manner, wafer bowing measurements can be obtained during the epitaxial growth of semiconductor layers. The control unit can adjust the operation of the heating unit (e.g., RF coils) to generate a heating radiation that imparts a uniform temperature distribution over the substrate. In one embodiment, the control unit can adjust the heating unit as a function of the wafer bowing measurements.

Figure 13:
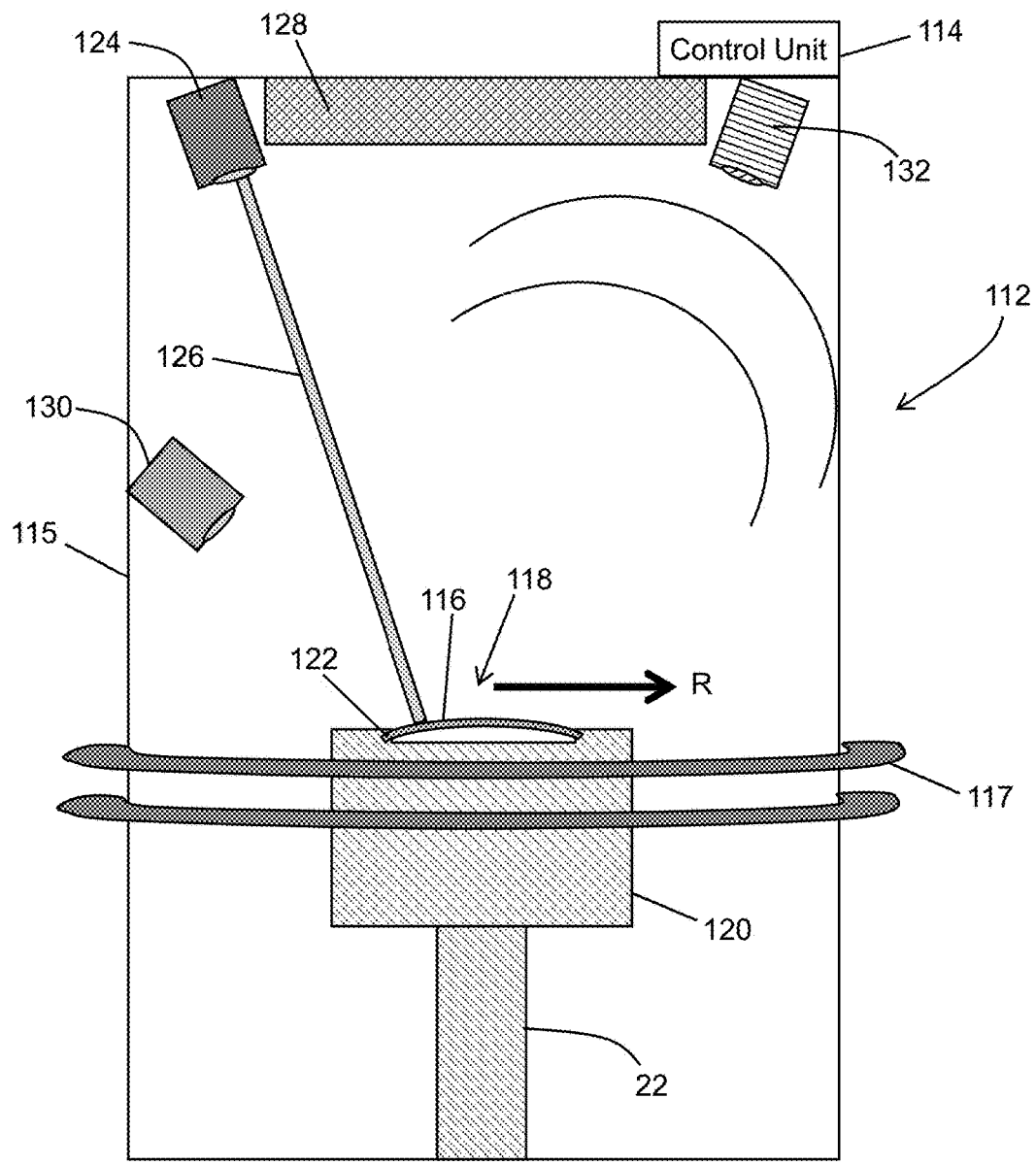
FIG. 13 shows a schematic of a system having an in-situ measurement unit and a control unit used with a MOCVD growth chamber to obtain bowing measurements during epitaxial growth of semiconductor layers that can be used to adjust the heating radiation over a substrate according to an embodiment.

FIG. 13 shows a schematic of an in-situ measurement unit 112 and a control unit 114 used with a MOCVD growth chamber 115 to obtain bowing measurements during the epitaxial growth of semiconductor layers that can be used to adjust the heating radiation to impart a uniform temperature distribution over a substrate according to an embodiment. In one embodiment, the in-situ measurement unit 112 can be configured to obtain a plurality of measurements from the surface 116 of the region 118 of a susceptor 120 supporting a substrate wafer 122 during the epitaxial growth of the semiconductor layers. As shown in FIG. 13, the in-situ measurement unit 112 can include at least one laser 124 used for measurements. In one embodiment, the laser 124 can direct heating radiation 126 to a portion of the surface 116 of the region 118 of the susceptor 120 supporting the wafer 122 and heat this portion by utilizing the motion of the beam embodied by the radiation 126.

In an embodiment, the laser 124 can be located in a top portion of the epitaxial growth chamber 115 near the showerhead element 128. In this manner, the laser 124 can direct the radiation to a particular location on the surface of the wafer 122. In one embodiment, the radiation generated from the laser 124 can be in the form of a particular pattern. In another embodiment, the laser 124 can introduce lateral alloy inhomogeneities in an $Al_xIn_yB_zGa_{1-x-y-z}N$ semiconductor alloy by affecting the diffusion rate of precursors and the flow dynamics of precursor gases at different regions within the semiconductor layers that epitaxial grown in the chamber 115.

The in-situ measurement unit 112 can also include at least one optical detector 130. The optical detector 130 can include, but is not limited to, an infrared camera, a photodetector, and/or the like. In one embodiment, the optical detector 130 can obtain photoluminescence and/or cathodoluminescence measurements and generate signal representations of these measurement to the control unit 114. The control unit 114 can determine the presence of any lateral inhomogeneities on the semiconductor layers during the epitaxial growth process based on these measurements. With this information, the control unit 114 can adjust the laser 124 direction and/or intensity to affect areas having inhomogeneities. In one embodiment, the control unit 114 can change one of the operating parameters associated with the laser 124. The operating parameters of the laser 124 can include, but are not limited to, the heating intensity, the duration that the laser directs radiation to the wafer 122, and the position and/or direction of the laser with respect to the wafer.

In one embodiment, the optical detector 130 can be used to obtain wafer bowing measurements of the wafer 122 during the epitaxial growth process and generate signal representations to the control unit 114. The control unit 114 can adjust the operation of the heating unit 117 (e.g., RF coils or the like) to generate a heating radiation that imparts a predetermined amount bowing to the wafer 122 through the use of thermal expansion of the wafer. In particular, the control unit 114 can adjust the heating unit 117 as a function of the wafer bowing measurements obtained by the optical detector 130. For example, when bowing above a target value is detected, the heating unit can induce changes in the temperature of the semiconductor layers which, due to thermal expansion, affects the stresses within the layers resulting in changes to the bowing.

It is understood that the in-situ measurement unit 112 is not meant to be limited to only one laser 124 and one optical detector 130 as depicted in FIG. 13. More than one laser 124 and one optical detector 130 can be used in the chamber 115 shown in FIG. 13. Furthermore, the locations of the laser 124 and the optical detector 130 within the MOCVD growth chamber 115 can vary from what is illustrated in FIG. 13.

In one embodiment, the MOCVD growth chamber 115 can also include at least one temperature sensor 132 configured to sense a temperature of the region of the wafer 122 supported by the susceptor 120 while being heated by the heating unit 117, and while the in-situ measurement unit 112 operates to perform its intended functions. The temperature sensor 132 used with the in-situ measurement unit 112 can include a pyrometer, however, it is understood that other types of temperature sensors can be used. Although only one temperature sensor 132 is depicted in FIG. 13, additional temperature sensors can be deployed about the chamber 115 to obtain temperature measurements in the portions of the chamber and generate signal representations of the measured temperature values provided by the heating unit. It is understood that there are many possible variations, alternatives and modifications to the number, location and orientation of the temperature sensor 132.

The control unit 114 can use the temperature measurements from the temperature sensor 132 to control heating of the susceptor 120 and the wafer 122 by the heating unit 117 as a function of the temperature measured by the temperature sensor 132. For example, the control unit 114 can determine a temperature distribution over the surface of the wafer 122 while heated by the heating unit 117. The control unit 114 can also monitor the temperature distribution over the surface of the wafer 122 while the susceptor 120 is heated by the heating unit. The control unit 114 can then adjust one of the aforementioned operating parameters for the heating unit to ensure that a target temperature distribution is attained. U.S. patent application Ser. No. 15/173,660 provides additional details of an in-situ measurement system for use in an epitaxial growth chamber and is incorporated herein by reference.

Figure 14:
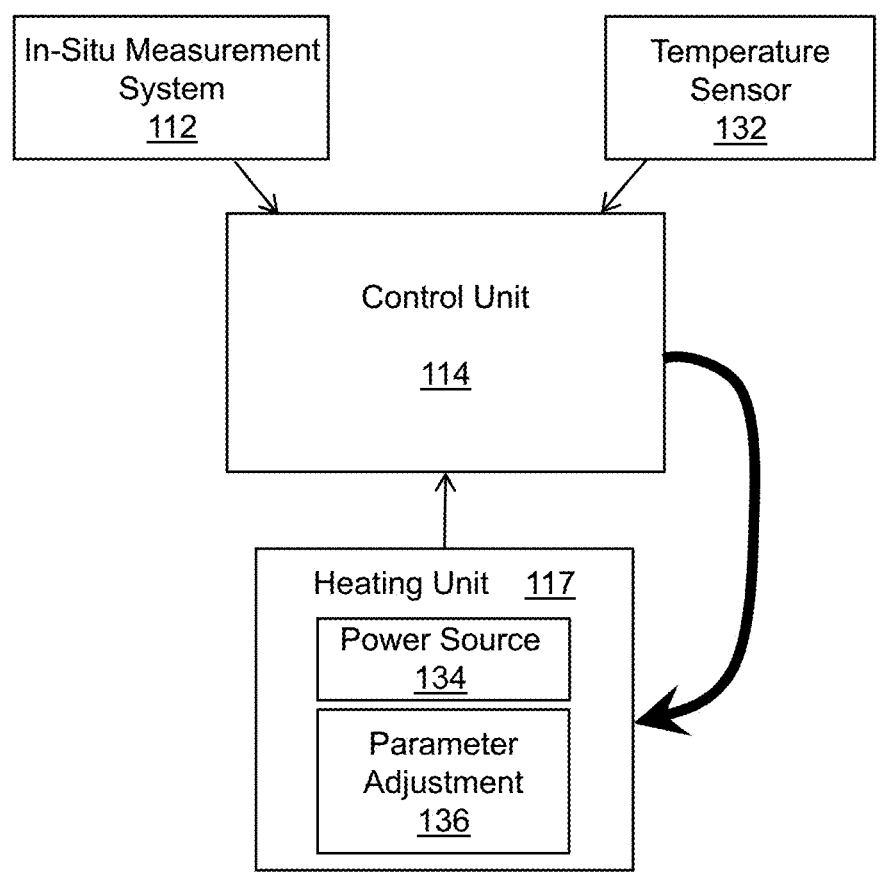
FIG. 14 shows a more detailed schematic of a control unit that can be used to control a heating unit, a temperature sensor and an in-situ measurement unit in an MOCVD growth process to attain a target temperature distribution over a substrate according to an embodiment.

FIG. 14 shows a more detailed schematic of a control unit that can be used to control the heating unit 117, the temperature sensor 132 and the in-situ measurement unit 112 in an MOCVD growth process to attain a target temperature distribution over a substrate according to an embodiment. As shown in FIG. 14, the heating unit 117 can include a power source 134 that enables it to generate heating radiation to a susceptor used in a MOCVD chamber. In addition, the heating unit 117 can include a parameter adjustment component 136 that can be used to generate heating radiation at a predetermined intensity, duration, position, direction and pattern at a wafer or wafers supported by the susceptor. It is understood that the parameter adjustment components 136 can be used to adjust other parameters. For example, the parameter adjustment component 136 can adjust parameters that can include peak wavelength and light angular distribution. Another parameter that can be adjusted for the heating unit 117 can include the time dependence of the intensity of different heating sources for both units.

The control unit 114 can control the temperature at the surface of the wafer supported by the susceptor in an MOCVD growth chamber during growth of semiconductor layers by first obtaining temperature measurements from the surface by the temperature sensor 132. In one embodiment, the temperature sensor can include a pyrometer, however, it is understood that other types of temperature sensors can be used. The control unit 114 can then determine a temperature distribution over the surface of the wafer while being heated by the heating unit 117. Next, the control unit 114 can determine whether the temperature distribution over the surface of the wafer satisfies a target temperature distribution. If the control unit 114 determines that the temperature distribution over the surface of the wafer fails to satisfy a target temperature distribution, the control unit 114 can adjust the heating generated from the heating unit. This can include instructing the parameter adjustment component 106 of the heating unit 117 and/or the parameter adjustment component 136 to adjust one or more of the aforementioned operating parameters to facilitate the target temperature distribution being attained at the surface of the wafer supported by the susceptor. In this manner, the control unit 114 can precisely control the heating unit 117 to enable heating of the surface of the wafer to the target temperature distribution.

FIG. 14 shows that the control unit 114 can also interact with the in-situ measurement unit 112, which can take the form of the aforementioned modalities and operate in a similar manner. As mentioned above, the in-situ measurement unit 112 can obtain a plurality of measurements from the surface of the wafer during the epitaxial growth of the semiconductor layers on the wafer. In one embodiment, the in-situ measurement unit 112 can obtain photoluminescence and/or cathodoluminescence measurements, which the control unit 114 can be used to determine the presence of any lateral inhomogeneity on the semiconductor layers during the epitaxial growth process based on these measurements. In this manner, the control unit 114 can adjust the auxiliary heating laser to affect the inhomogeneities.

In another embodiment, the in-situ measurement unit 112 can obtain wafer bowing measurements of the wafer during the epitaxial growth process and generate signal representations to the control unit 114. The control unit 114 can adjust operation of the heating unit 117 to generate a heating radiation that imparts a predetermined amount bowing to the wafer through the use of thermal expansion of the wafer. In general, the in-situ measurement unit 112 can also interact with the control unit 114 to adjust the heating elements intensity, position, duration, orientation, and/or the like, to deliver a target temperature distribution over the susceptor surface.

Figure 15:
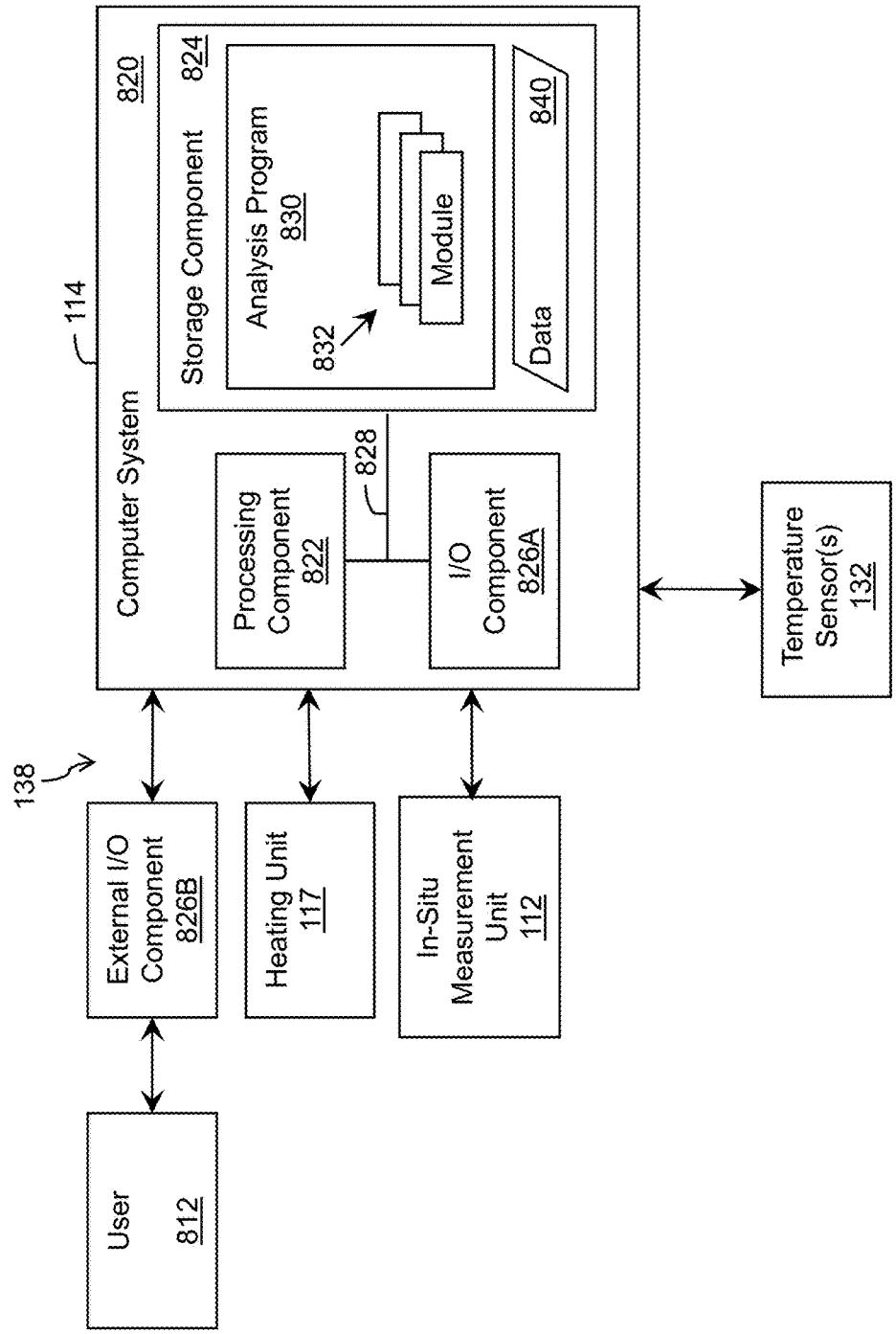
FIG. 15 shows a schematic of an illustrative environment depicting the operation of a heating unit, a temperature sensor, an in-situ measurement unit, and a control unit for use with a susceptor supporting a wafer for epitaxial growth of semiconductor layers according to an embodiment.

FIG. 15 shows a schematic of an illustrative environment 138 depicting operation of the heating unit 117, the temperature sensor 132, the in-situ measurement unit 112, and the control unit 114 for use with precisely controlling a temperature distribution over a region of the wafer supported by a susceptor during epitaxial growth of semiconductor layers according to an embodiment. As depicted in FIG. 15, control unit 114 can be implemented as a computer system 820 including an analysis program 830, which makes the computer system 820 operable to manage the heating unit 117, the temperature sensor 132, and the in-situ measurement unit 112 in the manner described herein. In particular, the analysis program 830 can enable the computer system 820 to operate the heating unit 117, the temperature sensor 132, and the in-situ measurement unit 112 and process data corresponding to one or more attributes regarding these components, and/or an historical data stored as data 840. This data 840 can include, but is not limited to, spatial time dependent temperature maps of heated wafers, operating spatial time dependent temperature maps of heated wafers and grown wafer characteristics, and operating spatial time dependent temperature maps of the heated wafers, the grown wafer characteristics and means for data mining to correlate the wafer quality to the temperature growth regimes.

In an embodiment, during operation, the computer system 820 can acquire data from the temperature sensor 132 and/or the in-situ measurement unit 112 regarding one or more attributes of the wafer, the susceptor, the heating unit 117, and generate data 840 for further processing. The computer system 820 can use the data 840 to control one or more aspects of the heating radiation generated by the heating unit 117 during epitaxial growth of semiconductor layers.

Furthermore, one or more aspects of the operation of the heating unit 117 and/or the in-situ measurement unit 112 can be controlled or adjusted by a user 812 via an external I/O component 826B. The external I/O component 826B can include a touch screen that can selectively display user interface controls, such as control dials, which can enable the user 812 to adjust one or more of the operating parameters. In an embodiment, the external I/O component 826B could conceivably include a keyboard, a plurality of buttons, a joystick-like control mechanism, and/or the like, which can enable the user 812 to control one or more aspects of the operation of the heating unit 117 and/or the in-situ measurement unit 112. The external I/O component 826B also can include one or more output devices (e.g., an LED, a visual display, a speaker, and/or the like), which can be operated by the computer system 820 to indicate operational information to the user 812. For example, the output devices can include one or more LEDs used for example, for emitting a visual light for the user 812 regarding the temperature of the wafer(s) during an epitaxial growth process of semiconductor layers.

The computer system 820 is shown including a processing component 822 (e.g., one or more processors), a storage component 824 (e.g., a storage hierarchy), an input/output (I/O) component 826A (e.g., one or more I/O interfaces and/or devices), and a communications pathway 828. In general, the processing component 822 executes program code, such as the analysis program 830, which is at least partially fixed in the storage component 824. While executing program code, the processing component 822 can process data, which can result in reading and/or writing transformed data from/to the storage component 824 and/or the I/O component 826A for further processing. The pathway 828 provides a communications link between each of the components in the computer system 820. The I/O component 826A and/or the external I/O component 826B can comprise one or more human I/O devices, which enable a human user 812 to interact with the computer system 820 and/or one or more communications devices to enable a system user 812 to communicate with the computer system 820 using any type of communications link. To this extent, during execution by the computer system 820, the analysis program 830 can manage a set of interfaces (e.g., graphical user interface(s), application program interface, and/or the like) that enable human and/or system users 812 to interact with the analysis program 830. Furthermore, the analysis program 830 can manage (e.g., store, retrieve, create, manipulate, organize, present, etc.) the data, such as data 840, using any solution. Unless otherwise noted, the phrase "any solution" means any now known or later developed solution.

In any event, the computer system 820 can comprise one or more general purpose computing articles of manufacture (e.g., computing devices) capable of executing program code, such as the analysis program 830, installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, the analysis program 830 can be embodied as any combination of system software and/or application software.

Furthermore, the analysis program 830 can be implemented using a set of modules 832. In this case, a module 832 can enable the computer system 820 to perform a set of tasks used by the analysis program 830, and can be separately developed and/or implemented apart from other portions of the analysis program 830. When the computer system 820 comprises multiple computing devices, each computing device can have only a portion of the analysis program 830 fixed thereon (e.g., one or more modules 832). However, it is understood that the computer system 820 and the analysis program 830 are only representative of various possible equivalent monitoring and/or control systems that may perform a process described herein with regard to the control unit 114, the heating unit 117, the in-situ-measurement unit 112, and the temperature sensor 132. To this extent, in other embodiments, the functionality provided by the computer system 820 and the analysis program 830 can be at least partially be implemented by one or more computing devices that include any combination of general and/or specific purpose hardware with or without program code. In each embodiment, the hardware and program code, if included, can be created using standard engineering and programming techniques, respectively. In another embodiment, the control unit 114 can be implemented without any computing device, e.g., using a closed loop circuit implementing a feedback control loop in which the outputs of one or more sensors are used as inputs to control the operation of the heating unit 117, and/or the in-situ measurement unit 112. Illustrative aspects of the invention are further described in conjunction with the computer system 820. However, it is understood that the functionality described in conjunction therewith can be implemented by any type of monitoring and/or control system.

Regardless, when the computer system 820 includes multiple computing devices, the computing devices can communicate over any type of communications link. Furthermore, while performing a process described herein, the computer system 820 can communicate with one or more other computer systems, such as the user 812, using any type of communications link. In either case, the communications link can comprise any combination of various types of wired and/or wireless links; comprise any combination of one or more types of networks; and/or utilize any combination of various types of transmission techniques and protocols.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A method, comprising:
    determining a first temperature profile of a substrate supported by a susceptor in an MOCVD growth chamber for a MOCVD growth process in which semiconductor layers are epitaxially grown on the substrate; and
    forming a temperature-controlled layer with a non-uniform thickness on one of a backside of the substrate or a top surface of the susceptor, wherein the temperature-controlled layer results in a target temperature profile for the substrate in the MOCVD growth process distinct from the first temperature profile, wherein the non-uniform thickness is determined as a function of the first temperature profile and the target temperature profile, wherein forming the temperature-controlled layer comprises profiling the substrate with a shape that optimizes temperature uniformity during each state of the MOCVD growth process, wherein the shape of the substrate is profiled as a function of the first temperature profile and the target temperature profile, and wherein profiling the substrate with a shape comprises forming a concave surface.

2. The method of claim 1, wherein the temperature-controlled layer comprises a metallic domain, the metallic domain placed over a central area of the substrate, wherein the metallic domain has a continuous thickness profile, and wherein the thickness is greater in the central area and decreases gradually towards the edges of the substrate.

3. The method of claim 1, wherein the temperature-controlled layer comprises a metallic domain, and wherein the metallic domain has a melting temperature that is greater than 2000° C.

4. The method of claim 1, wherein the temperature-controlled layer comprises a metallic domain, and wherein the metallic domain comprises one of a foil, a mesh of mesh elements, and resistive heating elements.

5. The method of claim 1, wherein the temperature-controlled layer comprises a metallic domain, further comprising one of annealing the metallic domain at a temperature for obtaining one of metal/substrate bonding and metal/susceptor bonding, evaporating the metallic domain over the substrate with a non-uniform thickness, and bonding the metallic domain with a bonding material at a temperature for one of metal/substrate bonding and metal/susceptor bonding.

6. The method of claim 1, wherein profiling the substrate with a shape comprises thinning the substrate towards the edges.

7. The method of claim 1, wherein profiling the substrate with a shape comprises forming individual indented spaced segments within a surface of the substrate, the individual indented spaced segments collectively establishing a segmented concave surface.

8. The method of claim 7, wherein each of the individual indented segments contain a material selected from the group consisting of a metallic material, a composite metallic dielectric/semiconductor material, and a semiconductor material.

9. The method of claim 1, wherein profiling the substrate with a shape comprises forming circular channel regions within the substrate, the circular channel regions differing by thickness.

10. The method of claim 9, furthering comprising forming a metallic domain in some of the circular channel regions and a dielectric material or semiconductor material of low electrical conductivity in some of the circular channel regions.

11. The method of claim 1, wherein profiling the substrate with a shape comprises forming a plurality of nanochannels over a surface of the substrate.

12. The method of claim 1, wherein forming the temperature-controlled layer comprises profiling the susceptor with a shape that optimizes temperature uniformity during each state of the MOCVD growth process, wherein the shape of the susceptor is profiled as a function of the first temperature profile and the target temperature profile.

13. A method, comprising:
    determining a temperature profile of a substrate supported by a susceptor in an MOCVD growth chamber for a MOCVD growth process in which semiconductor layers are epitaxially grown on the substrate;
    profiling the susceptor with a shape that optimizes temperature uniformity during the MOCVD growth process, wherein profiling the susceptor with the shape comprises one of: beveling a top surface of the susceptor from a central portion of the susceptor to the edges of the susceptor or forming a concave region along a top surface of the susceptor;
    selecting an electrically conducting metal having a high melting temperature that optimizes a temperature uniformity over the substrate during the MOCVD growth process, wherein the electrically conducting material is selected as a function of the temperature profile and the melting temperature is greater than 2000° C.;
    forming at least one domain of the electrically conducting metal on one of a backside of the substrate or a top surface of the susceptor prior to initiating the MOCVD growth process, wherein the electrically conducting metal is formed on a location that has a need for increased heating according to the temperature profile; and
    performing the MOCVD growth process with the substrate and the susceptor in the MOCVD growth chamber with the electrically conducting metal domain.

14. The method of claim 13, wherein the electrically conducting metal comprises at least one of molybdenum or tungsten.

15. The method of claim 13, further comprising forming at least one domain of one of a temperature conductive semiconductor material and a dielectric material on one of a backside of the substrate and a top surface of the susceptor.

16. A system, comprising:
    a wafer substrate profiled with a shape that optimizes temperature uniformity during each state of a MOCVD growth process, wherein the shape forms a concave surface;
    a wafer carrier supporting the wafer substrate;
    at least one metallic domain formed on one of a backside of the wafer substrate or a top surface of the wafer carrier to increase temperature uniformity during the MOCVD growth process;
    a heating unit configured to heat the wafer substrate on the wafer carrier; and a control unit configured to control heating of the wafer carrier by the heating unit during the MOCVD growth process.

17. The system of claim 16, the wafer substrate includes individual indented spaced segments within a surface of the substrate, the individual indented spaced segments collectively establishing a segmented concave surface.

18. The system of claim 17, wherein each of the individual indented segments contains a material selected from the group consisting of: a metallic material, a composite metallic dielectric/semiconductor material, and a semiconductor material.

* * * * *